United States Patent [19]

Polinsky et al.

[11] 4,151,538
[45] Apr. 24, 1979

[54] NONVOLATILE SEMICONDUCTIVE MEMORY DEVICE AND METHOD OF ITS MANUFACTURE

[75] Inventors: Murray A. Polinsky, Somerville; William N. Lewis, Bridgewater, both of N.J.

[73] Assignee: RCA Corp., New York, N.Y.

[21] Appl. No.: 873,713

[22] Filed: Jan. 30, 1978

[51] Int. Cl.² ............................................. H01L 29/78
[52] U.S. Cl. ........................................ 357/23; 357/52; 357/54
[58] Field of Search .............................. 357/23, 52, 54

[56] References Cited

U.S. PATENT DOCUMENTS

| | | | |
|---|---|---|---|
| 3,719,866 | 3/1973 | Naber | 357/54 |
| 4,011,576 | 3/1977 | Uchida et al. | 357/54 |
| 4,068,217 | 1/1978 | Arnett et al. | 357/54 |
| 4,101,921 | 7/1978 | Shimada et al. | 357/23 |

FOREIGN PATENT DOCUMENTS 53-30310  8/1978  Japan .......................................... 357/23

Primary Examiner—Edward J. Wojciechowicz
Attorney, Agent, or Firm—H. Christoffersen; D. S. Cohen; Sanford J. Asman

[57] ABSTRACT

An MNOS nonvolatile semiconductive memory device of the type which has a thick gate insulating layer overlapping the source and drain regions and a thin gate insulator layer in the memory portion of the device includes a region of relatively high concentration of impurities of the same type conductivity as the substrate in the portion of the channel which is beneath the thin gate insulating layer. This increases the values of both the low threshold and the high threshold states of the memory portion of the devide, so as to increase the threshold voltage window of the device. The region is formed by ion implantation in such a manner that the thin gate insulator layer is also doped resulting in a device having improved stability.

10 Claims, 5 Drawing Figures

NONVOLATILE SEMICONDUCTIVE MEMORY DEVICE AND METHOD OF ITS MANUFACTURE

This invention relates to nonvolatile semiconductive memory devices and particularly to those known as MNOS field effect transistors.

MNOS devices employed as binary storage devices are well known. Early MNOS structures used a gate insulating layer of silicon dioxide about 20 Å in thickness on the surface of the substrate body with a silicon nitride layer on the silicon dioxide layer. The thin silicon dioxide layer overlapped the source and drain PN junctions and the result was that the breakdown voltage of the drain relative to the substrate was relatively low. The breakdown voltage between the drain or the source relative to the gate was relatively low. Efforts to solve the breakdown voltage problem in MNOS devices led to structures such as those disclosed in an article entitled, "The Drain Source Protected MNOS Memory Device and Memory Endurance", at the 1973 International Electronic Devices Meeting, at pages 126–128. In that structure, a relatively thick gate oxide layer overlaps the source and drain and lies over portions of the channel region adjacent to the source and drain so that the thin gate oxide, i.e. the memory portion of the device, is located centrally in the channel and over only a portion of the channel. While that device eliminates the breakdown voltage problem and exhibits a bivalued threshold voltage, the difference between the low and high threshold states (commonly called the threshold window) can be increased.

A method of increasing the difference between the low and the high threshold states of an MNOS device is described in U.S. Pat. No. 4,011,576 issued to Uchida et al. on Mar. 8, 1977. In that device, the portions of the channel which underlie the thicker portions of the gate oxide layer are doped lightly with conductivity modifiers of the type opposite to that of the substrate. That decreases the effective threshold voltage of those portions while the two threshold states of the memory portion of the device remain the same, thereby increasing the threshold window. An alternative method of increasing the threshold window while simultaneously improving the stability and reliability of the device and other structures which may be on the chip is desirable.

Figure 1:
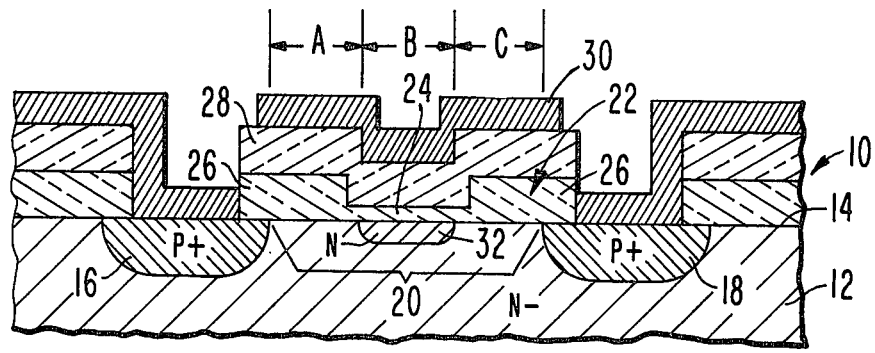
FIG. 1 is a diagrammatic, partial cross-section of the present MNOS device.

The present improved nonvolatile MNOS semiconductive memory device is illustrated at 10 in FIG. 1. The device 10 is formed in a body of semiconductor material 12, usually silicon, of one type conductivity (N- type in this example) which has a surface 14 adjacent to which the elements of the device 10 are formed. Spaced source and drain regions 16 and 18 are in the body 12 adjacent to the surface 14 and define the ends of a channel region 20 of controllable conductivity. The general relation of the source and drain regions 16 and 18 and the channel region 20 is similar to standard practice in the art.

A first insulating layer 22 is disposed on the surface 14 over the channel region 20. The first insulating layer 22 has a thin, charge-tunnelling portion 24 over part of the channel region 20 and a thick, non-tunnellng portion 26 over the rest of the channel region 20. In this example, the thin portion 24 of the first insulating layer 22 is disposed centrally over the channel region 20 so that the part of the channel region 20 beneath the thin portion 24 of the first insulating layer 22 has ends which are spaced from each of the source and drain regions 16 and 18. Other relative structures of the thin and thick protions of the first insulating layer 22 may also be used, such as the structure shown in FIG. 2 in U.S. Pat. No. 3,719,866 issued to Naber et al. on Mar. 6, 1973.

Typically, when the material of the body 12 is silicon, the first insulating layer 22 is of thermally grown silicon dioxide. The thin portion 24 usuallyhas a thickness of about 20 Å, although thicknesses up to about 50 Å are acceptable. The thick portion 26 is also of thermally grownsilicon dioxide having a thickness of about 500 Å.

A second insulating layer 28, usually of silicon nitride (although other materials such as aluminum oxide are also acceptable), about 500 Å thick, is disposed on the first insulating layer 22. A gate electrode layer 30 is on the second insulating layer 28 and the relationship between the gate electrode layer 30 and the insulating layers 28 and 22 is generally the known relationship of the prior art, such as described in the Naber et al. patent referred to above.

Unlike known devices, the present device 10 is characterized by the presence of a zone 32 of the channel region 20 beneath at least some of the thin portion 24 of the first insulating layer 22. The zone 32 has a concentration of conductivity modifiers (N type in this example) which is greater than the concentration of conductivity modifiers in the portion of the channel region 20 which lies beneath the thick portion 26 of the first insulating layer 22. In the example illustrated, the zone 32 of the channel region 20 underlies less than all of the thin portion 24 of the first insulating layer 22, and no part of the zone 32 underlies the thick portion 26 of the first insulating layer 22. That results from the processing used to make the device 10. Overlap of the zone 32 with the thick portion 26 of the first insulating layer 22 should be avoided because such overlap would affect the overall threshold characteristics of the device 10 in the high conduction state.

Figure 2:
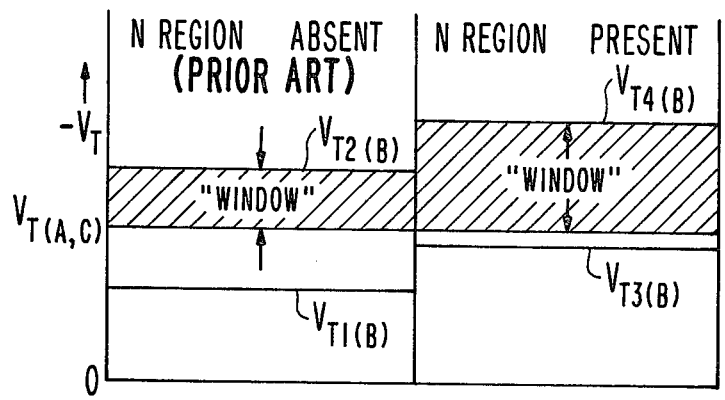
FIG. 2 is a diagram illustrating the difference between the present device and a device constructed according to the prior art.

The effect of the presence of the conductivity modifiers in the zone 32 of the channel region 20 on the threshold window of the device is illustrated in FIG. 2, which compares the present device 10 to a device like the one described in the Naber et al. patent referred to above. In this diagram, a horizontal line $V_{T(A,C)}$ represents the threshold voltage of the portions of the device having the thick portion 26 of the first insulating layer 22 beneath the gate electrode 30, labeled as A and C in FIG. 1. For comparative purposes, it is assumed that this threshold voltage is the same for the prior art device and the present device 10. The two threshold states of the prior art device are labeled $V_{T1(B)}$ and $V_{T2(B)}$ in FIG. 2. In this example, the value of $V_{T1(B)}$ is less negative than the value of $V_{T(A,C)}$ and the value of $V_{T2(B)}$ is more negative than $V_{T(A,C)}$. The device can be thought of as two transistors in series, and the threshold window of the device is the voltage difference between that of one transistor, $V_{T(A,C)}$, and that of the high state of the other transistor, $V_{T2(b)}$. When the memory threshold is at $V_{T2(B)}$, the device can conduct only when the voltage on the gate electrode 30 has a value greater (more negative) than $V_{T2(B)}$. When the memory threshold is at $V_{T1(B)}$, the device can conduct only when the voltage on the gate electrode 30 is above $V_{T(A,C)}$.

The effect of the additional conductivity modifiers in the zone 32 of the present device 10 is represented at the right side of FIG. 2. The assumption is made that the absolute value of the voltage difference between the two states of the memory portion of the device is the same as that in the prior art device, but the actual values of the two states, labeled $V_{T3(B)}$ and $V_{T4(B)}$, are more negative than the comparable values in the prior art device, owing to the presence of the zone 32. Thus, the threshold window is expanded. The present device 10 may, therefore, be read more accurately because less precise values of the read voltage on the gate electrode may be tolerated. Additionally, it has been found that the memory retention time of the device 10 is increased, because of the larger window. The lowering of the threshold of the thicker insulator portions of the device as in the device described by Uchida et al. in U.S. Pat. No. 4,011,576, provides a similar result.

Figure 3:
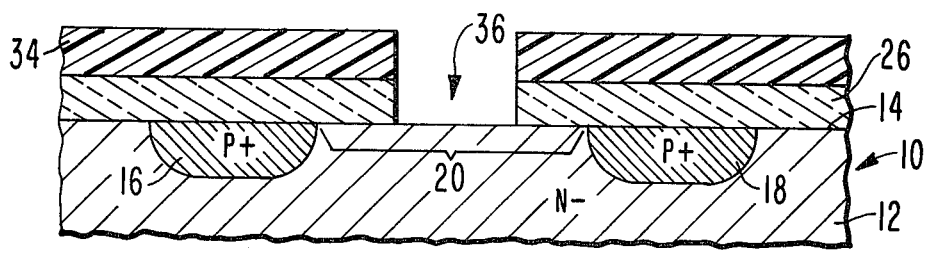
FIGS. 3 to 5 are a series of partial, cross-sectional views illustrating the present novel method of making the device of FIG. 1.
Figure 4:
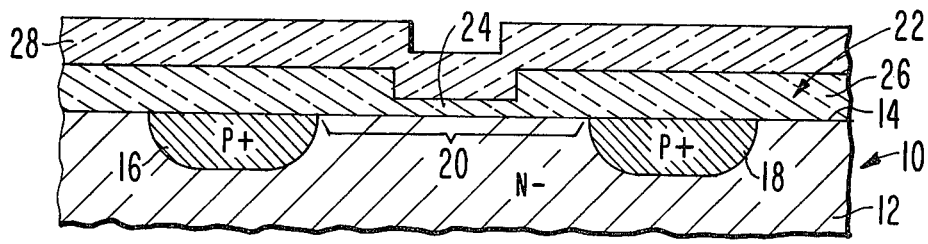
Figure 5:
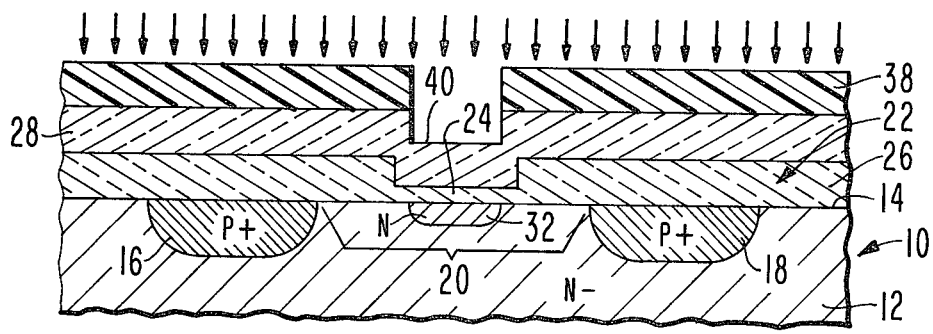

The present method of making an MNOS memory device is illustrated in FIGS. 3 to 5. The steps illustrated are those which characterize the present invention and other steps which are conventionally performed are omitted for clarity.

The cross-section of FIG. 3 represents the condition of the device 10 after the formation of the source and drain regions 16 and 18 and the formation of the thick portion 26 of the first insulating layer 22. A photoresist layer 34 is provided on the upper surface of the thick portion 26 of the first insulating layer 22 and is exposed to define the location, generally designated as 36, of the thin portion 24 of the first insulating layer 22. After the photoresist layer 34 is developed, the thick portion 26 of the layer 22 is etched down to th surface 14 of the body 12.

Next, the thin tunnelling portion 24 of the first insulating layer 22 is formed as shown in FIG. 4. Then the silicon nitride layer 28 is formed by conventional chemical vapor deposition process.

Next, conductivity modifiers, such as phosphorus, arsenic or antimony, are introduced into the portion 24 of the first insulating layer 22 and into the portion of the channel region 20 which will eventually lie beneath the thin portion 24 of the first insulating layer 22 to increase the concentration thereof in that portion to a value higher than the concentration of modifiers in the portion of the channel region 20 beneath the thick portion 26 of the first insulating layer 22. Preferably, this introduction step is carried out by applying a new photoresist layer 38 shown in FIG. 5 which is defined to expose the silicon nitride layer 28 at a location 40 above the area intended for the zone 32 and then subjecting the device to a beam of phosphorus ions in a conventional ion implantation apparatus. This produces the zone 32 in the body 12 and implants phosphorus into the portion 24 of the first insulating layer 22. Because the implant is through about 500 Å of silicon nitride, relatively high implant energy must be used, but this is an advantage because most ion implantation machines run better at higher energy. Typically, the energy of the implant may be 45 keV at a dosage of $5 \times 10^{12}$ atoms/cm$^2$. The photoresist layer 38 is not always necessary, since the thicker portions 26 of the first insulating layer can act as a mask if appropriate implantation conditions are selected. Care must be taken in this case, however, to minimize post-implantation heat treatments which might cause lateral diffusion of the implanted phosphorus.

After the implantation step, conventional processing is resumed. The photoresist layer 38 is removed and conventional contact opening and metallization steps are performed to produce the completed device as shown in FIG. 1.

What is claimed is:

1. An improved nonvolatile semiconductive memory device formed in a body of semiconductive material of one type conductivity having a surface with spaced source and drain regions of opposite type conductivity in said body adjacent to said surface and defining the ends of a channel region of controllable conductivity, a first insulating layer on said surface over said channel region, said first insulating layer having a thin, charge tunnelling portion over part of said channel region and a thick non-tunnellng portion over the rest of the said channel region, a second insulating layer on said first insulating layer, and a gate electrode layer on said second insulating layer, wherein the improvement comrises:

at least a portion of said channel region beneath said thin portion of said first insulating layer having a concentration of conductivity modifiers of said one type greater than the concentration of conductivity modifiers in the portion of said channel region beneath said thick portion of said first insulating layer, and said thin portion of said first insulating layer containing conductivity modifiers of said one type embedded therein.

2. The device defined in claim 1 wherein said thin portion of said first insulating layer is disposed centrally over said channel region so that said part of said channel region has ends spaced from each of said source and drain regions.

3. The device defined in claim 1 wherein said semiconductive material is silicon, said thin portion of said first insulating layer is of silicon dioxide having a thickness of about 20 Å and said thick portion of said first insulating layer is of silicon dioxide having a thickness of about 500 Å.

4. The device defined in claim 3 wherein said second insulating layer is of silicon nitride.

5. The device defined in claim 4 wherein said one type conductivity is N type, said source and drain regions are of P type conductivity and said conductivity modifiers in said portion of said channel region beneath said thin portion of said first insulating layer and in said thin portion of said first insulating layer are phosphorus atoms.

6. A method of making an improved nonvolatile semiconductive memory device formed in a body of semiconductor material of one type conductivity having a surface with spaced source and drain regions of opposite type conductivity in said body adjacent to said surface and defining the ends of a channel region of controllable conductivity, a first insulating layer on said surface over said channel region, said first insulating layer having a thin, charge tunnelling portion over part of said channel region and a thick non-tunnelling portion over the rest of the said channel region, a second insulating layer on said first insulating layer and a gate electrode layer on said second insulating layer, and simultaneously introducing conductivity modifiers into said thin portion of said first insulating layer.

7. The method defined in claim 6 wherein said conductivity modifiers are introduced by the process of ion implantation.

8. The method defined in claim 7 wherein said semiconductor material is N type silicon, said thin portion of said first insulating layer is silicon dioxide having a thickness of about 20 Å, said thick portion of said first insulating layer is silicon dioxide having a thickness of abaout 500 Å, said second insulating layer is silicon nitride, and said ion implanted conductivity modifiers are phosphorus atoms.

9. The method defined in claim 8 in which said introducing step is performed subsequent to the formation of said silicon nitride layer.

10. The method defined in claim 9 wherein the energy of said ion implantation introducing step is such that phosphorus atoms are implanted in said thin portion of said first insulating layer and into said portion of said channel region.

* * * * *